(12) United States Patent
Lee (10) Patent No.: US 7,532,042 B2
(45) Date of Patent: May 12, 2009

(54) PRECISION SAMPLING CIRCUIT

(75) Inventor: Hae-Seung Lee, Bedford, MA (US)

(73) Assignee: Cambridge Analog Technologies, Inc., Bedford, MA (US)

( * ) Notice: Subject to any disclaimer, the term of this patent is extended or adjusted under 35 U.S.C. 154(b) by 0 days.

(21) Appl. No.: 11/621,770

(22) Filed: Jan. 10, 2007

(65) Prior Publication Data

US 2007/0146018 A1 Jun. 28, 2007

Related U.S. Application Data

(63) Continuation-in-part of application No. 11/558,114, filed on Nov. 9, 2006, now abandoned.

(60) Provisional application No. 60/735,641, filed on Nov. 10, 2005.

(51) Int. Cl.
*G11C 27/02* (2006.01)
(52) U.S. Cl. .......................... 327/91; 327/94
(58) Field of Classification Search .......... 327/91, 327/94
See application file for complete search history.

(56) References Cited

U.S. PATENT DOCUMENTS

| 4,066,919 A | * | 1/1978 | Huntington | ............. | 327/94 |
| 4,276,513 A | | 6/1981 | Johnston et al. | | |
| 4,543,534 A | | 9/1985 | Temes et al. | | |
| 5,187,390 A | | 2/1993 | Scott, III | | |
| 5,343,089 A | * | 8/1994 | Itakura et al. | ............. | 327/94 |
| 5,359,294 A | * | 10/1994 | Ganger et al. | ............. | 330/258 |
| 5,495,192 A | * | 2/1996 | Shou et al. | ............. | 327/94 |
| 5,831,562 A | * | 11/1998 | Van Auken et al. | ......... | 341/122 |
| 5,936,437 A | * | 8/1999 | Kusumoto et al. | ............. | 327/94 |
| 5,986,599 A | * | 11/1999 | Matsuo | ............. | 341/158 |
| 6,020,769 A | * | 2/2000 | Vallancourt | ............. | 327/94 |

(Continued)

FOREIGN PATENT DOCUMENTS

EP 0438927 7/1991

(Continued)

OTHER PUBLICATIONS

Martin, Ken, "Improved circuits for the realization of switched-capacitor filters" IEEE Transactions on Circuits and Systems, CAS-27, No. 4, Apr. 1980, pp. 237-244.

(Continued)

*Primary Examiner*—Kenneth B. Wells
(74) *Attorney, Agent, or Firm*—Gauthier & Connors LLP (57) ABSTRACT

A sampling circuit includes an input voltage source; a first switch having an input operatively connected to the input voltage source; a sampling capacitor operatively connected to an output of the first switch; an operational amplifier having an inverting input operatively connected to the sampling capacitor; a second switch operatively connected across the inverting input of the operational amplifier and an output of the operational amplifier; and a second capacitor operatively connected to the output of the first switch. The first switch has a variable parasitic capacitance, and the second capacitor has a substantially more linear capacitance than the variable parasitic capacitance and is in parallel with the variable parasitic capacitance. A combined variable parasitic capacitance and capacitance of said switch capacitor is more linear than the variable parasitic capacitance of the first switch.

14 Claims, 12 Drawing Sheets

U.S. PATENT DOCUMENTS

| | | | |
|---|---|---|---|
| 6,084,440 A * | 7/2000 | Sousa | 327/94 |
| 6,556,072 B1 | 4/2003 | Nicollini et al. | |
| 6,577,168 B1 * | 6/2003 | Kakitani | 327/94 |
| 6,650,177 B1 | 11/2003 | Tan | |
| 6,972,619 B2 | 12/2005 | Sato et al. | |
| 2006/0220692 A1 | 10/2006 | Hirashima | |

FOREIGN PATENT DOCUMENTS

| | | |
|---|---|---|
| JP | 07086935 | 3/1995 |
| WO | 200184716 | 11/2001 |

OTHER PUBLICATIONS

Martin et al., "A Differential Switched-Capacitor Amplifier" IEEE Journal of Solid-State Circuits, vol. sc-22, No. 1, Feb. 1987, pp. 104-106.

Malboreti,"Switched-capacitor building block for analogue processing" Electron Letters, 1983 pp. 263-265.

* cited by examiner

PRECISION SAMPLING CIRCUIT

PRIORITY INFORMATION

This application is a continuation-in-part application of co-pending U.S. patent application Ser. No. 11/558,114, which was filed on Nov. 9, 2006. The present application claims priority, under 35 U.S.C. §120, from co-pending U.S. patent application Ser. No. 11/558,114, filed on Nov. 9, 2006. Co-pending U.S. patent application Ser. No. 11/558,114, which was filed on Nov. 9, 2006, claimed priority, under 35 U.S.C. §119(e), from U.S. Provisional Patent Application Ser. No. 60/735,641, which was filed on Nov. 10, 2005. The present application claims priority, under 35 U.S.C. §119(e), from U.S. Provisional Patent Application Ser. No. 60/735,641, which was filed on Nov. 10, 2005. The entire contents of U.S. patent application Ser. No. 11/558,114, which was filed on Nov. 9, 2006, and U.S. Provisional Patent Application Ser. No. 60/735,641, which was filed on Nov. 10, 2005, are hereby incorporated by reference.

FIELD OF THE PRESENT INVENTION

The present invention relates generally to a sampling circuit for switched-capacitor filters, analog-to-digital converters, and delta-sigma modulators. More particularly, the present invention relates to a ground-side sampling circuit which produces a removable constant channel charge error.

BACKGROUND OF THE PRESENT INVENTION

Figure 1:
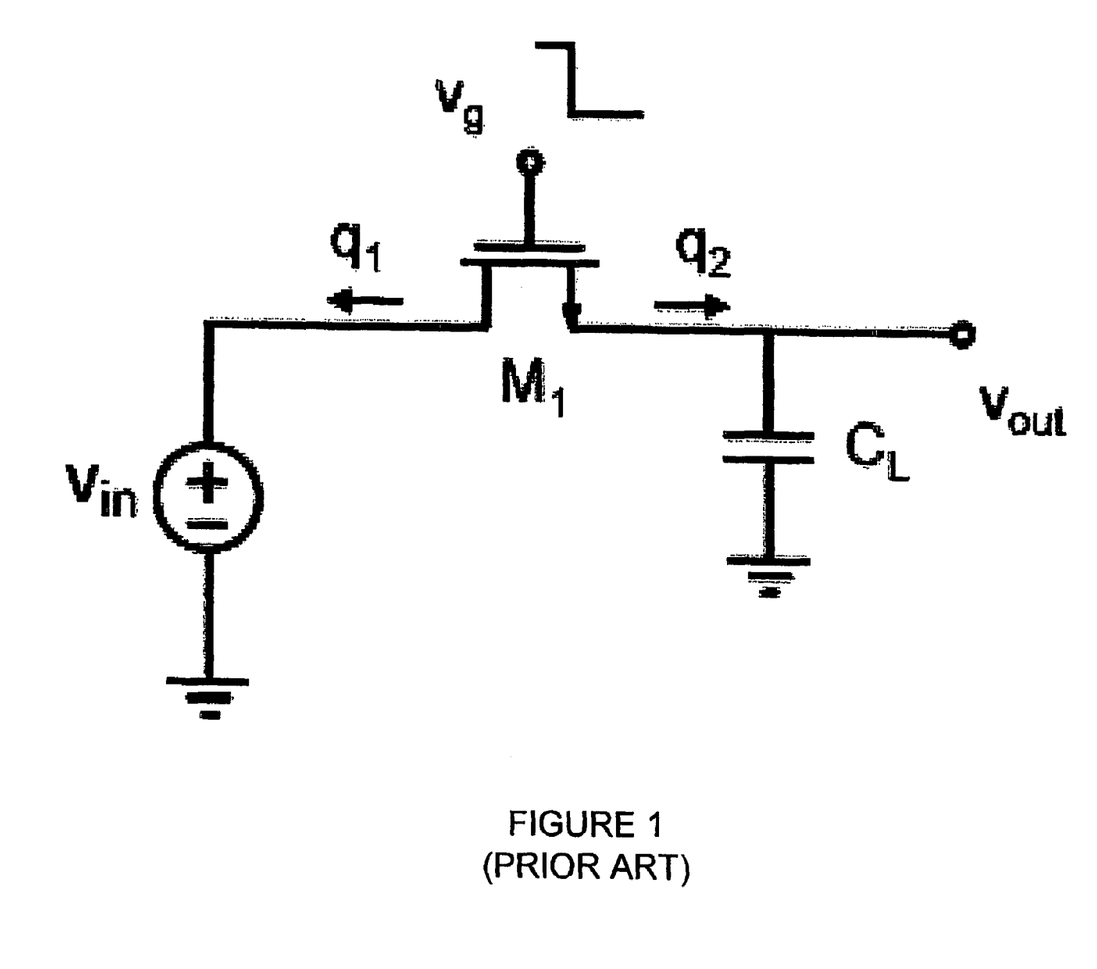
FIG. 1 illustrates a prior art sampling switch.

Most switched-capacitor analog circuits such as switched-capacitor filters, analog-to-digital converters, and delta-sigma modulators require precise sampling of analog voltages on a capacitor. The charge sampled on the sampling capacitor must be a precise linear function of the voltage that has been sampled. A basic sampling circuit is illustrated in FIG. 1.

The MOS transistor $M_1$ is operated as a switch. When the gate voltage $V_g$ is high, MOS transistor $M_1$ is turned ON, and the output voltage $V_{out}$ is equal to the input voltage $V_{in}$. The charge, q, on the sampling capacitor $C_L$ is equal to $V_{in}C_L$.

When $V_g$ goes low, MOS transistor $M_1$ turns OFF, and sampling capacitor $C_L$ is isolated from the input. If MOS transistor $M_1$ were an ideal switch, the charge, q, sampled on sampling capacitor $C_L$ would remain unaltered. However, the MOS transistor $M_1$ is not an ideal switch and thus injects MOS transistor $M_1$ charge onto sampling capacitor $C_L$.

Part of the injected charge is from the channel charge, and the rest is due to capacitive coupling from the gate terminal of MOS transistor $M_1$ to the output node. The capacitive coupling generally gives a constant offset error and does not give rise to nonlinearity. The channel charge in MOS transistor $M_1$ splits into two components, $q_1$ and $q_2$, when MOS transistor $M_1$ is turned OFF. The component $q_2$ causes an error with respect to the charge, q, on the sampling capacitor $C_L$. In other words, the charge, q, on the sampling capacitor $C_L$ is equal to $V_{in}C_L + q_2$.

The channel charge in MOS transistor $M_1$ is a function of the input voltage because the gate-to-source voltage $V_{gs}$ of MOS transistor $M_1$ is equal to $V_g - V_{in}$.

It is well known that the channel charge of a MOS transistor is a nonlinear function of the gate-to-source voltage. Since the channel charge is a nonlinear function of the input voltage, the resulting charge error is a nonlinear function of the input voltage.

Figure 2:
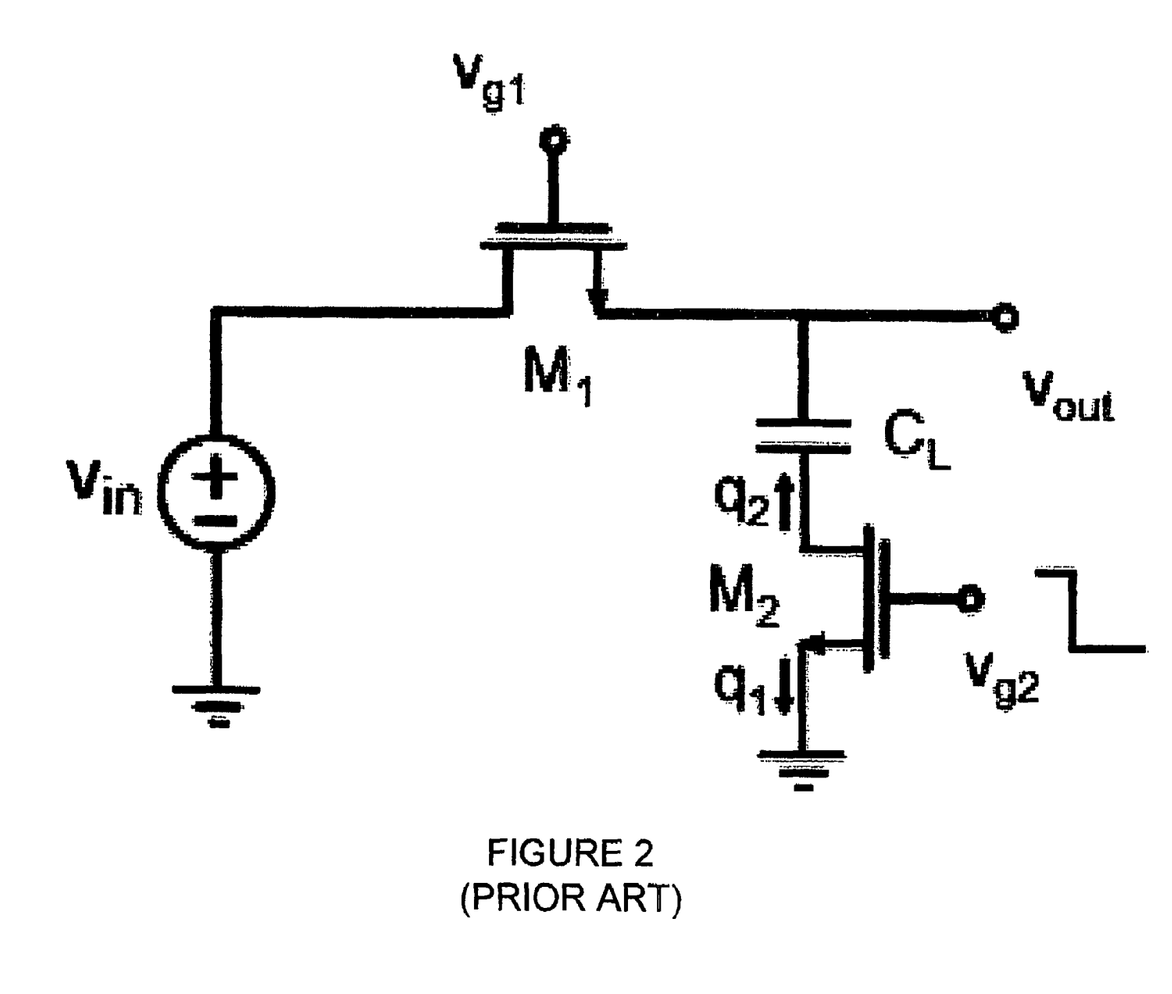
FIG. 2 illustrates another prior art sampling switch.

Conventionally, ground-side sampling, as illustrated in FIG. 2, removes the input dependence of the charge injection in the first order. In the sampling circuit, shown in FIG. 2, two MOS transistors are employed, the source-side transistor $M_1$ and the ground-side transistor $M_2$. When both transistors, $M_1$ and $M_2$, are turned ON, the input voltage $V_{in}$ is applied across the sampling capacitor $C_L$. The sample is taken when the gate voltage $V_{g2}$ of the ground-side transistor $M_2$ is lowered, thereby turning ground-side transistor $M_2$ OFF. The channel charge in ground-side transistor $M_2$ splits into two components as before, $q_1$ and $q_2$, when ground-side transistor $M_2$ is turned OFF. The component $q_2$ causes an error with respect to the charge, q, on the sampling capacitor $C_L$. In other words, the charge, q, on the sampling capacitor $C_L$ is equal to $V_{in}C_L - q_2$.

In contrast to the circuit of FIG. 1, the channel charge in ground-side transistor $M_2$ is independent of the input voltage $V_{in}$, at least to the first order. This is because the source and the drain voltages are at ground potential when ground-side transistor $M_2$ is ON. Thus, if the ratio of the channel charge split between $q_1$ and $q_2$ is constant, the charge error, $q_2$, will be constant rather than a nonlinear function of the input voltage. Such a constant offset error can be readily removed or minimized.

For high accuracy application, even a small amount of nonlinearity in $q_2$, due to second order effects, is often a limiting factor. For example, the channel charge in ground-side transistor $M_2$ may be dependent of the input voltage $V_{in}$ due to a second order effect.

The second order effect is due to the impedance variation in source-side transistor $M_1$. The ON resistance of source-side transistor $M_1$ varies with the input voltage $V_{in}$. In addition, the parasitic capacitance associated with source-side transistor $M_1$ is a nonlinear function of the input voltage $V_{in}$.

Figure 3:
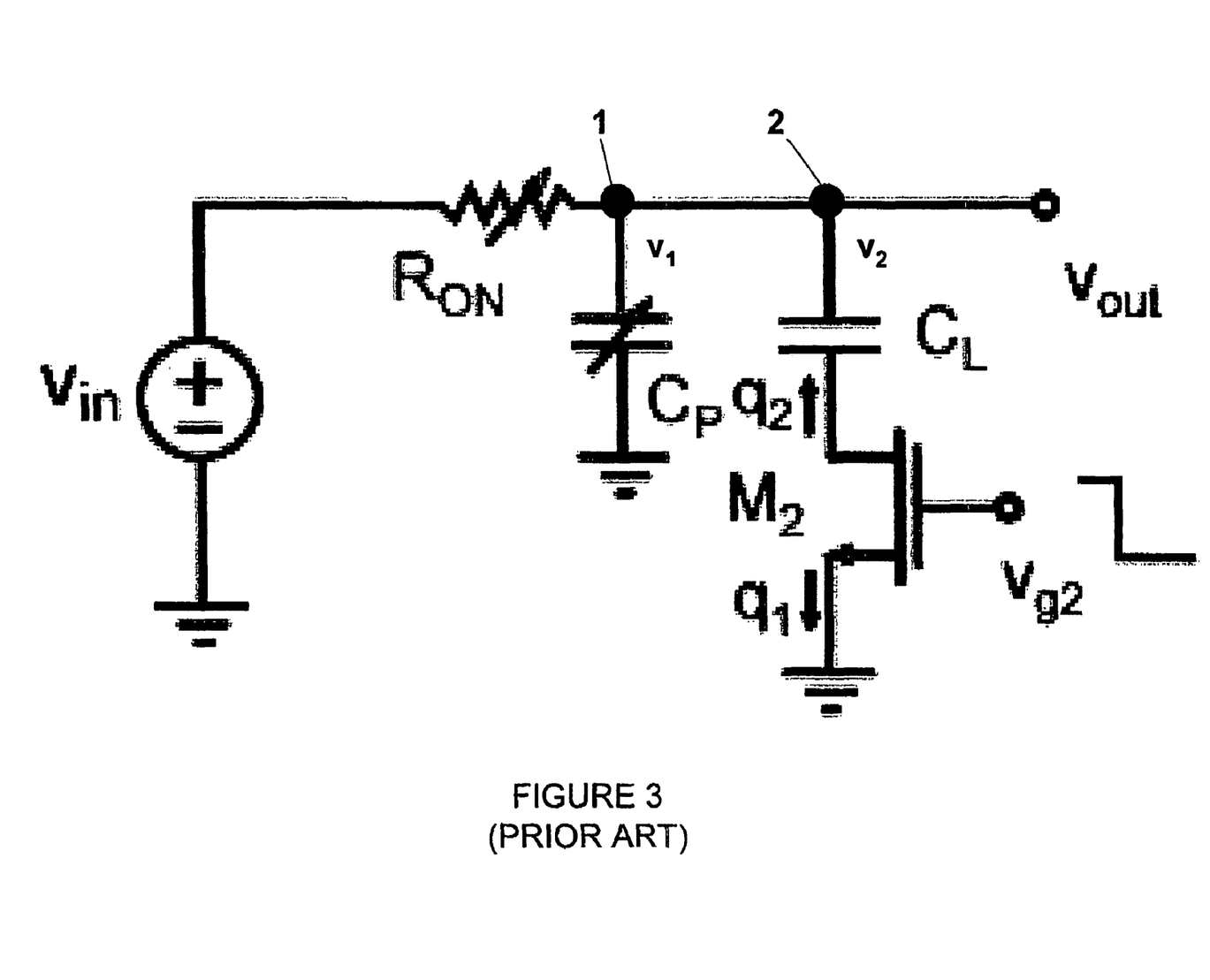
FIG. 3 illustrates a circuit model of the prior art sampling switch illustrated in FIG. 2.

In FIG. 3, the variable ON resistance of source-side transistor $M_1$ is shown as $R_{ON}$, and the variable parasitic capacitance $C_P$. As the gate voltage $V_{g2}$ is lowered to turn OFF ground-side transistor $M_2$, the channel charge splits into $q_1$ and $q_2$. This process is not instantaneous, but takes a finite amount of time on the order of the transit time of carriers in ground-side transistor $M_2$.

As $q_2$ leaves ground-side transistor $M_2$, current, corresponding to $i = dq_2/dt$, flows into the network consisting of $C_L$, $R_{ON}$, and $C_P$. This current creates a time-dependent voltage at the drain node of ground-side transistor $M_2$, in turn creating an electric field between the drain and the source of ground-side transistor $M_2$. This effect alters the split ratio between $q_1$ and $q_2$. Since the time-dependent voltage on the drain of ground-side transistor $M_2$ is a function of the composite impedance given by $C_L$, $R_{ON}$, and $C_P$, the charge split ratio between $q_1$ and $q_2$ is dependent on the input voltage $V_{in}$. Since $R_{ON}$ and $C_P$ are nonlinear functions of the input voltage $V_{in}$, the injected charge $q_2$ is a nonlinear function of $V_{in}$.

Although source-side transistor $M_1$ and ground-side transistor $M_2$ are shown as NMOS transistors in FIG. 2, a parallel connection of NMOS and PMOS transistors, commonly referred to as a complementary switch, is often conventionally employed. The complementary switches somewhat alleviate the nonlinear charge injection, but not to a satisfactory extent with respect to utilization in high accuracy circuits.

It is noted that if the time constant, $R_{ON}C_P$, is much faster than the carrier transit time, the impedance presented by $R_{ON}$ dominates within the time scale of the charge injection. In this situation, the instantaneous incremental voltages $v_1$ and $v_2$ at Nodes 1 and 2, respectively, are $v_1 = (dq_2/dt)R_{ON}$ and $v_2 = v_1 + (q_2/C_L) = (dq_2/dt)R_{ON} + (q_2/C_L)$.

On the other hand, if the time constant, $R_{ON}C_P$, is much slower than the carrier transit time, the impedance presented by $C_P$ dominates within the time scale of the charge injection. In this situation, the instantaneous incremental voltages $v_1$ and $v_2$ at Nodes 1 and 2, respectively, are $v_1 = q_2/C_P$ and $v_2 = v_1 + (q_2/C_L) = q_2/C_P + q_2/C_L = q_2(1/C_P + 1/C_L)$.

In either situation, the instantaneous changes in $v_2$ create an electric filed across ground-side transistor $M_2$. This effect alters the split ratio between $q_1$ and $q_2$ in turn affecting the magnitude of $q_2$. Since $v_2$ is nonlinearly dependent on the input voltage $V_{in}$ through either $R_{ON}$ or $C_P$, the resulting $q_2$ is also a nonlinear function of the input voltage $V_{in}$.

Therefore, it is desirable to provide a sampling circuit that accurately samples an input voltage without suffering from the nonlinear error introduced by charge injection. It is desirable to provide a sampling circuit that accurately samples an input voltage without suffering from the nonlinear error introduced by charge injection and provides differential signal paths for sampled-data circuits. Furthermore, it is desirable to provide a sampling circuit that reduces the effect of power supply, substrate, and common-mode noise by symmetric differential signal processing. Also, it is desirable to provide a sampled-data circuit that increases the signal range by incorporating differential signal paths.

SUMMARY OF THE PRESENT INVENTION

One aspect of the present invention is a sampling circuit. The sampling circuit includes an input voltage source; a first switch having an input operatively connected to the input voltage source; a sampling capacitor operatively connected to an output of the first switch; a second switch having an input operatively connected to the sampling capacitor; and a second capacitor operatively connected to the output of the first switch.

Another aspect of the present invention is a sampling circuit. The sampling circuit includes an input voltage source; a first switch having an input operatively connected to the input voltage source; a sampling capacitor operatively connected to an output of the first switch; an operational amplifier having an inverting input operatively connected to the sampling capacitor; a second switch operatively connected across the inverting input of the operational amplifier and an output of the operational amplifier; and a second capacitor operatively connected to the output of the first switch.

A further aspect of the present invention is a sampling circuit. The sampling circuit includes a first input voltage source; a first switch having an input operatively connected to the first input voltage source; a first sampling capacitor operatively connected to an output of the first switch; a differential amplifier having an inverting input operatively connected to the first sampling capacitor; a second switch operatively connected across the inverting input of the differential amplifier and a non-inverting output of the differential amplifier; and a second capacitor operatively connected to the output of the first switch.

BRIEF DESCRIPTION OF THE DRAWINGS

The present invention may take form in various components and arrangements of components. The drawings are only for purposes of illustrating a preferred embodiment and are not to be construed as limiting the present invention, wherein.

DETAILED DESCRIPTION OF THE PRESENT INVENTION

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

It is noted that, in the various Figures, the earth symbol indicates the system's common-mode voltage. For example, in a system with 2.5 V and −2.5 V power supplies, the system's common-mode voltage may be at ground. In a system with a single 2.5 power supply, the system's common-mode voltage may be at 1.25 V.

Figure 4:
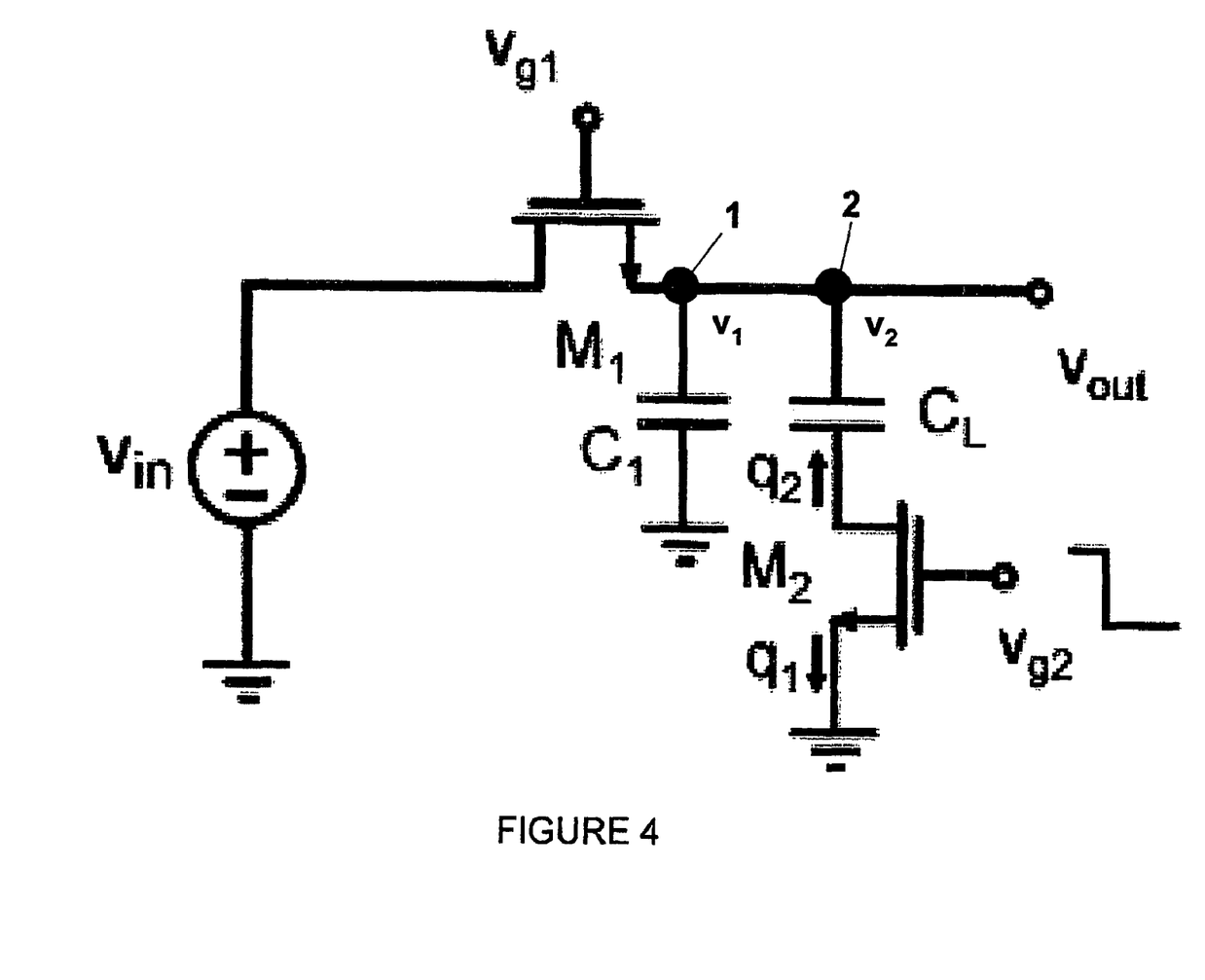
FIG. 4 illustrates a sampling switch according to the concepts of the present invention.

As noted above, FIG. 4 illustrates an example of a sampling circuit. As illustrated in FIG. 4, a capacitor $C_1$, which is substantially more linear than a variable parasitic capacitance $C_P$ of a source-side transistor $M_1$, is connected between Node 1 and a constant voltage. The constant voltage may be ground. In this embodiment, capacitor $C_1$ and variable parasitic capacitance $C_P$ are effectively in parallel and the capacitance value of capacitor $C_1$ may be significantly larger than the variable parasitic capacitance $C_P$. In this situation, the instantaneous incremental voltages $v_1$ and $v_2$ at Nodes 1 and 2, respectively, are $v_1 = q_2/(C_P + C_1)$ and $v_2 = v_1 + (q_2/C_L) = (q_2/(C_P + C_1)) + q_2/C_L = q_2((1/(C_P + C_1)) + 1/C_L)$.

The addition of the capacitor $C_1$ to the sampling circuit has several effects. First, the effect of input dependent $R_{ON}$ can be greatly reduced by making the time constant, $R_{ON}(C_P + C_1)$, much longer than the carrier transit time. Second, the combined capacitance $(C_P + C_1)$ is much more linear than $C_P$. Third, the magnitude of the voltage $v_2$ is reduced by the addition of $C_1$, further reducing the dependence of charge split ratio on the input voltage $V_{in}$. Since $C_1$ is much larger than $C_P$, $v_1$ is much smaller and less dependent on the input voltage $V_{in}$. Therefore, it follows that $v_2$ is much less dependent on $V_{in}$, giving a substantially constant split ratio between $q_1$ and $q_2$. Furthermore, the sampling circuit of FIG. 4 reduces the effect of substrate noise.

Figure 5:
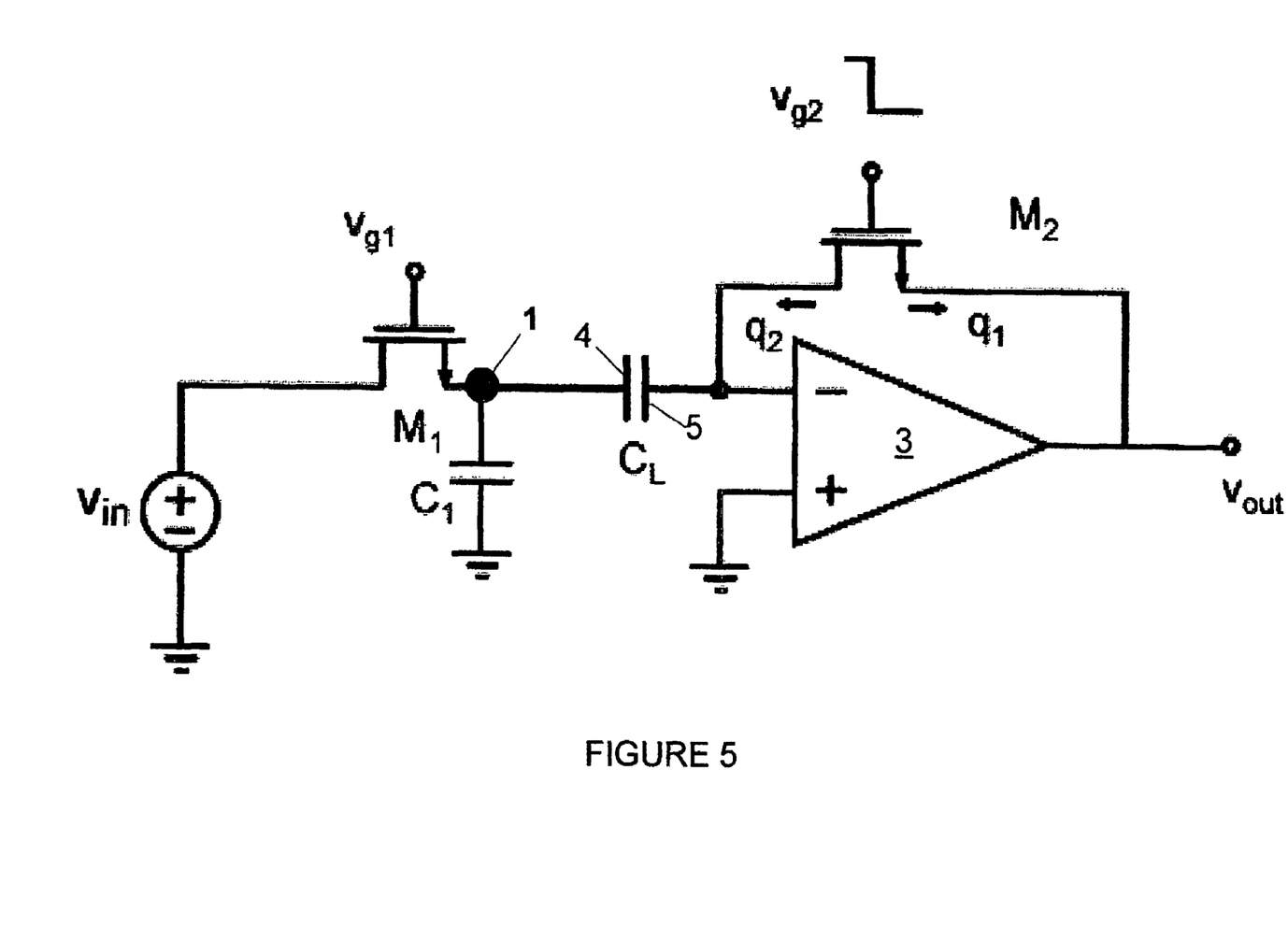
FIG. 5 illustrates a closed-loop sampling switch according to the concepts of the present invention.

FIG. 5 illustrates an example of a closed-loop sampling circuit. As illustrated in FIG. 5, a sampling switch $M_2$, when turned ON, connects the inverting input and the output of an operational amplifier 3. With an input switch $M_1$ turned ON, a first plate 4 of sampling capacitor $C_L$ receives the input voltage Vin, while a second plate 5 of the sampling capacitor $C_L$ settles to an offset voltage of the operational amplifier 3. A capacitor $C_1$, which is substantially more linear than a variable parasitic capacitance $C_P$ of the input switch $M_1$, is connected between Node 1 and a constant voltage. The constant voltage may be ground.

In this embodiment, capacitor $C_1$ and variable parasitic capacitance $C_P$ are effectively in parallel and the capacitance value of capacitor $C_1$ may be significantly larger than the variable parasitic capacitance $C_P$. When the sampling switch $M_2$ is turned OFF, charge is sampled on the capacitor $C_L$. The non-linear input dependent charge injection is greatly reduced in the similar manner to the embodiment of FIG. 4. The closed-loop sampling of FIG. 5 also removes the effect of the offset voltage associated with the operational amplifier 3, thereby enabling the closed-loop sampling circuit of FIG. 5 to be appropriate for analog-to-digital converters and other precision sampled-data circuits. Furthermore, the sampling circuit of FIG. 5 reduces the effect of substrate noise.

Figure 6:
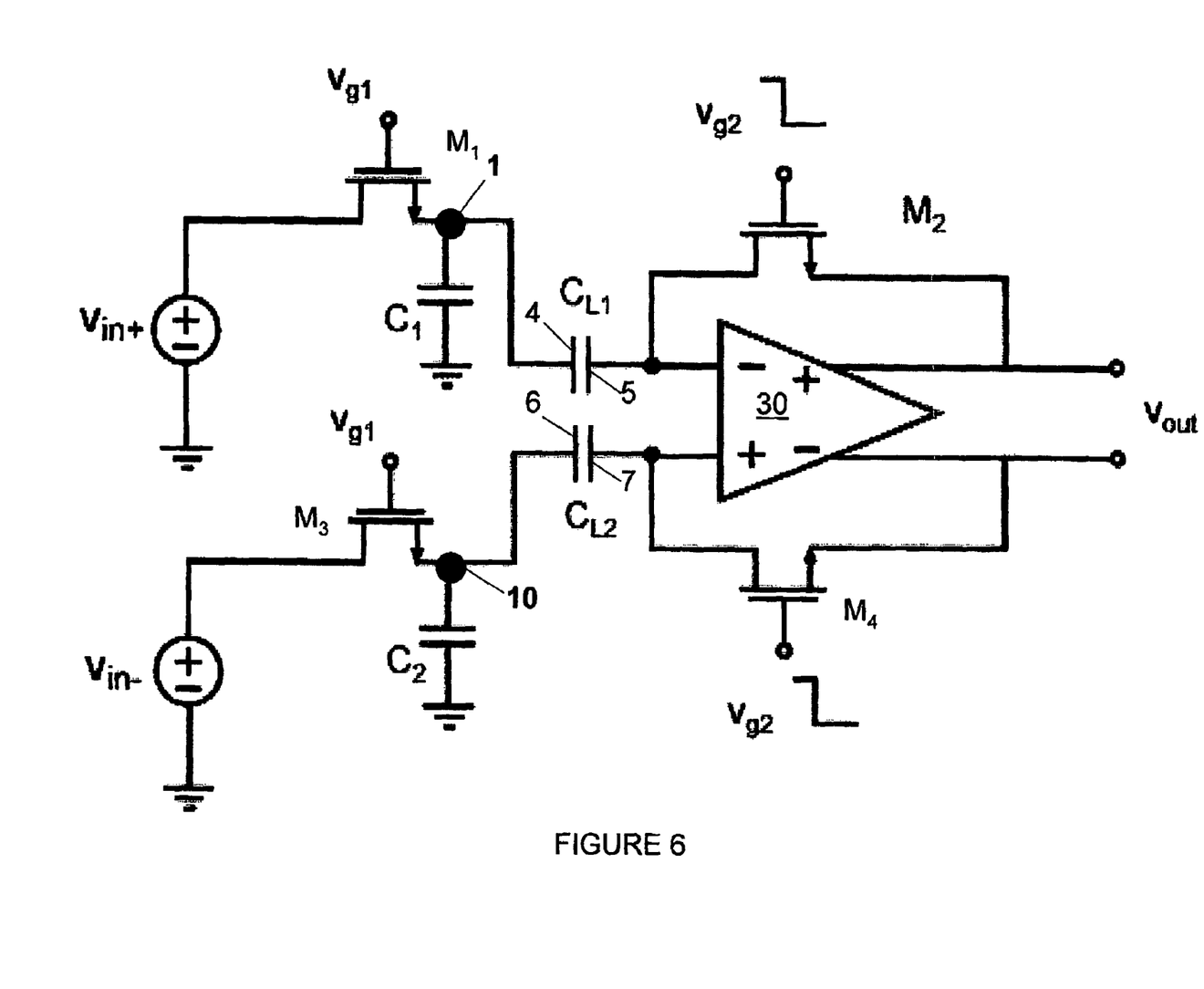
FIG. 6 illustrates a fully-differential closed-loop sampling switch according to the concepts of the present invention.

FIG. 6 illustrates an example of a fully differential closed-loop sampling circuit being employed in order to improve power supply and substrate rejection. As illustrated in FIG. 6, a sampling switch $M_2$, when turned ON, connects the inverting input and the non-inverting output of a differential amplifier 30. With an input switch $M_1$ turned ON, a first plate 4 of sampling capacitor $C_{L1}$ receives the input voltage $V_{in+}$, while a second plate 5 of the sampling capacitor $C_{L1}$ settles to an offset voltage of the differential amplifier 30. A capacitor $C_1$, which is substantially more linear than a variable parasitic capacitance $C_{P1}$ of the input switch $M_1$, is connected between Node 1 and a constant voltage. The constant voltage may be ground.

Moreover, as illustrated in FIG. 6, a sampling switch $M_4$, when turned ON, connects the non-inverting input and the inverting output of a differential amplifier 30. With an input switch $M_3$ turned ON, a first plate 6 of sampling capacitor $C_{L2}$ receives the input voltage $V_{in-}$, while a second plate 7 of the sampling capacitor $C_{L2}$ settles to a common-mode voltage of the differential amplifier 30. A capacitor $C_2$, which is substantially more linear than a variable parasitic capacitance $C_{P3}$ of the input switch $M_3$, is connected between Node 10 and a constant voltage. The constant voltage may be ground.

In this embodiment, capacitor $C_1$ and variable parasitic capacitance $C_{P1}$ are effectively in parallel and the capacitance value of capacitor $C_1$ may be significantly larger than the variable parasitic capacitance $C_{P1}$. When the sampling switch $M_2$ is turned OFF, charge is sampled on the capacitor $C_{L1}$. The non-linear input dependent charge injection is greatly reduced in the similar manner to the embodiment of FIG. 5.

Moreover, capacitor $C_2$ and variable parasitic capacitance $C_{P3}$ are effectively in parallel and the capacitance value of capacitor $C_1$ may be significantly larger than the variable parasitic capacitance $C_{P3}$. When the sampling switch $M_4$ is turned OFF, charge is sampled on the capacitor $C_{L2}$. The non-linear input dependent charge injection is greatly reduced in the similar manner to the embodiment of FIG. 5.

The closed-loop sampling of FIG. 6 also removes the effect of the offset voltage associated with the differential amplifier 30, thereby enabling the fully differential closed-loop sampling circuit of FIG. 6 to be appropriate for analog-to-digital converters and other precision sampled-data circuits. Furthermore, the sampling circuit of FIG. 6 reduces the effect of substrate noise.

Figure 7:
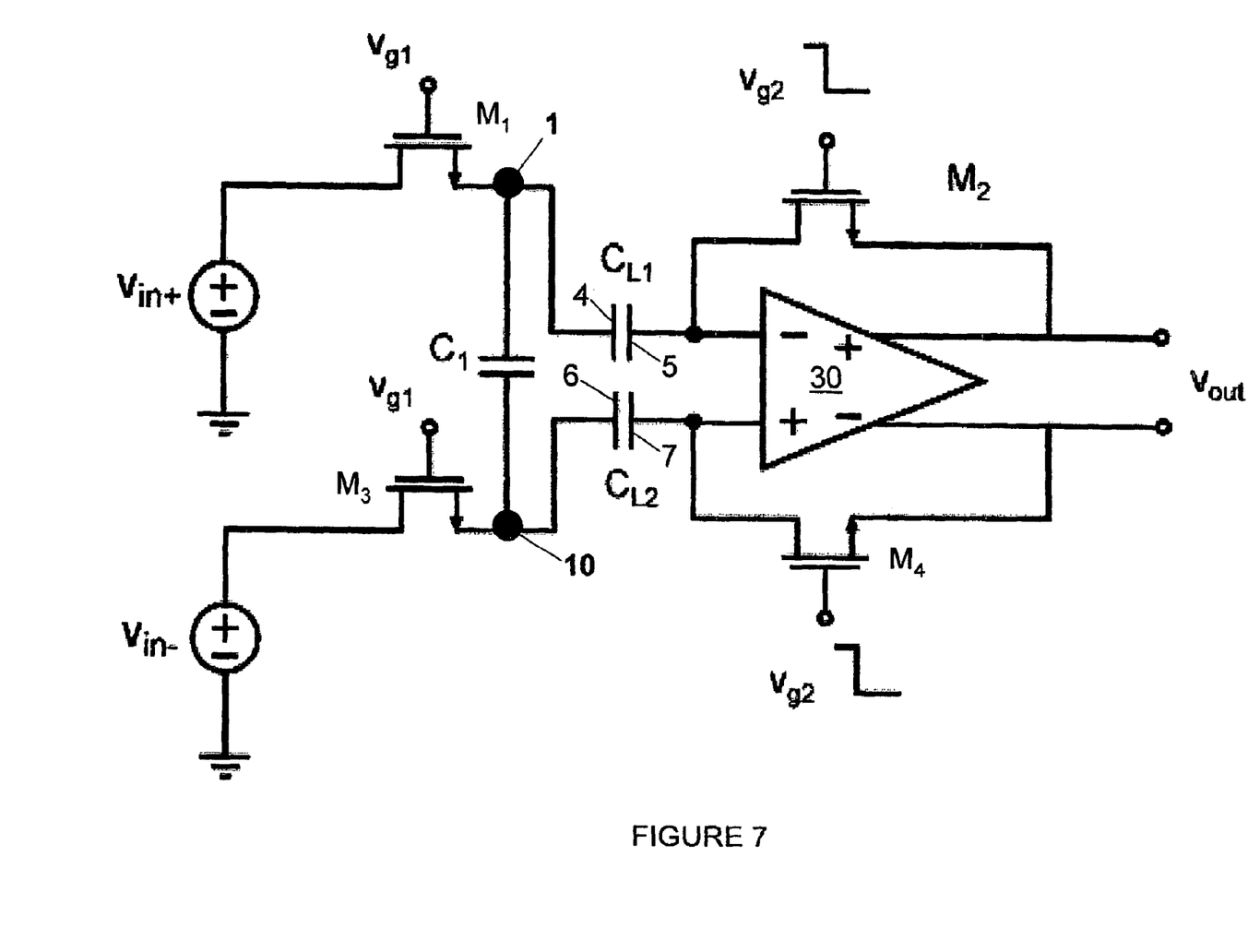
FIG. 7 illustrates another fully-differential closed-loop sampling switch according to the concepts of the present invention.

FIG. 7 illustrates another example of a fully differential closed-loop sampling circuit being employed in order to improve power supply, substrate rejection, and removal of a differential component of the nonlinear input dependent charge injection. As illustrated in FIG. 7, a sampling switch $M_2$, when turned ON, connects the inverting input and the non-inverting output of a differential amplifier 30. With an input switch $M_1$ turned ON, a first plate 4 of sampling capacitor $C_{L1}$ receives the input voltage $V_{in}$, while a second plate 5 of the sampling capacitor $C_{L1}$ settles to a common-mode of the differential amplifier 30.

Moreover, as illustrated in FIG. 7, a sampling switch $M_4$, when turned ON, connects the non-inverting input and the inverting output of a differential amplifier 30. With an input switch $M_3$ turned ON, a first plate 6 of sampling capacitor $C_{L2}$ receives the input voltage $V_{in}$, while a second plate 7 of the sampling capacitor $C_{L2}$ settles to a common-mode voltage of the differential amplifier 30. A capacitor $C_1$, which is substantially more linear than a variable parasitic capacitance $C_{P3}$ of the input switch $M_3$ or a variable parasitic capacitance $C_{P1}$ of the input switch $M_1$, is connected between Node 1 and Node 10.

In this embodiment, an effective capacitance, twice the value of $C_1$, and variable parasitic capacitance $C_{P1}$ are effectively in parallel and the capacitance value of capacitor $C_1$ may be significantly larger than the variable parasitic capacitance $C_{P1}$. When the sampling switch $M_2$ is turned OFF, charge is sampled on the capacitor $C_{L1}$. The non-linear input dependent charge injection is greatly reduced in the similar manner to the embodiment of FIG. 5.

Moreover, an effective capacitance, twice the value of $C_1$, and variable parasitic capacitance $C_{P3}$ are effectively in parallel and the capacitance value of capacitor $C_1$ may be significantly larger than the variable parasitic capacitance $C_{P3}$. When the sampling switch $M_4$ is turned OFF, charge is sampled on the capacitor $C_{L2}$. The non-linear input dependent charge injection is greatly reduced in the similar manner to the embodiment of FIG. 5.

The closed-loop sampling of FIG. 7 also removes the effect of the offset voltage associated with the differential amplifier 30 and removes the differential component of the nonlinear input dependent charge injection associated with the differential amplifier 30, thereby enabling the fully differential closed-loop sampling circuit of FIG. 7 to be appropriate for analog-to-digital converters and other precision sampled-data circuits. Furthermore, the sampling circuit of FIG. 7 reduces the effect of substrate noise.

Figure 8:
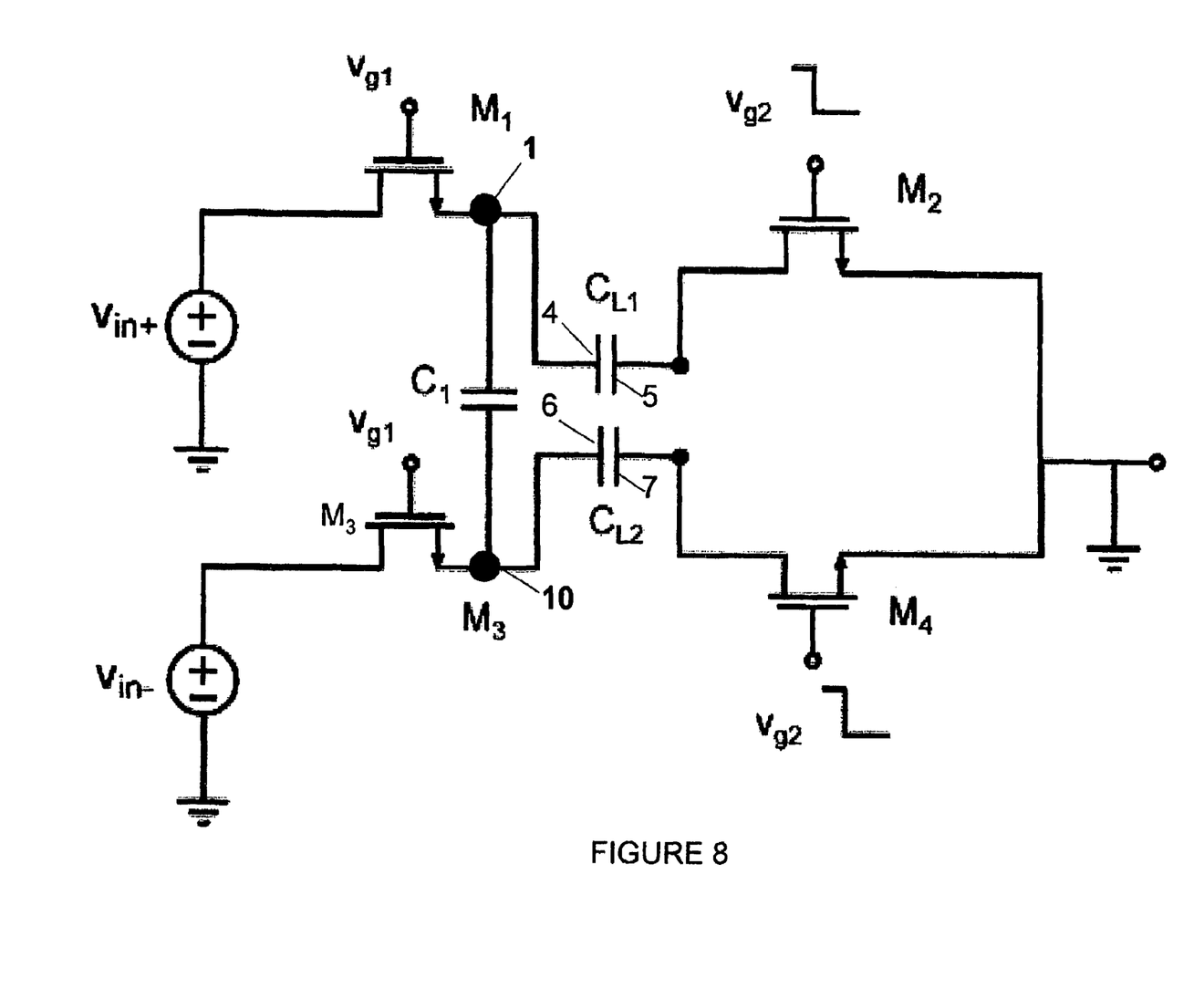
FIG. 8 illustrates a third fully-differential closed-loop sampling switch according to the concepts of the present invention.

FIG. 8 illustrates a third example of a fully differential sampling circuit being employed in order to improve power supply, substrate rejection, and removal of a differential component of the nonlinear input dependent charge injection. As illustrated in FIG. 8, when an input switch $M_1$ is turned ON, a first plate 4 of sampling capacitor $C_{L1}$ receives the input voltage $V_{in+}$. A sampling switch $M_2$, when turned ON, connects a second plate 5 of the sampling capacitor $C_{L1}$ to a constant voltage, preferably a common-mode voltage.

Moreover, as illustrated in FIG. 8, when an input switch $M_3$ is turned ON, a first plate 6 of sampling capacitor $C_{L2}$ receives the input voltage $V_{in-}$. A sampling switch $M_2$, when turned ON, connects a second plate 7 of the sampling capacitor $C_{L2}$ to a constant voltage, preferably a common-mode voltage. A capacitor $C_1$, which is substantially more linear than a variable parasitic capacitance $C_{P3}$ of the input switch $M_3$ or a variable parasitic capacitance $C_{P1}$ of the input switch $M_1$, is connected between Node 1 and Node 10.

In this embodiment, an effective capacitance, twice the value of $C_1$, and variable parasitic capacitance $C_{P1}$ are effectively in parallel and the capacitance value of capacitor $C_1$ may be significantly larger than the variable parasitic capacitance $C_{P1}$. When the sampling switch $M_2$ is turned OFF, charge is sampled on the capacitor $C_{L1}$. The non-linear input dependent charge injection is greatly reduced in the similar manner to the embodiment of FIG. 5.

Moreover, an effective capacitance, twice the value of $C_1$, and variable parasitic capacitance $C_{P3}$ are effectively in parallel and the capacitance value of capacitor $C_1$ may be significantly larger than the variable parasitic capacitance $C_{P3}$. When the sampling switch $M_4$ is turned OFF, charge is sampled on the capacitor $C_{L2}$. The non-linear input dependent charge injection is greatly reduced in the similar manner to the embodiment of FIG. 5. Furthermore, the sampling circuit of FIG. 8 reduces the effect of substrate noise.

Figure 9:
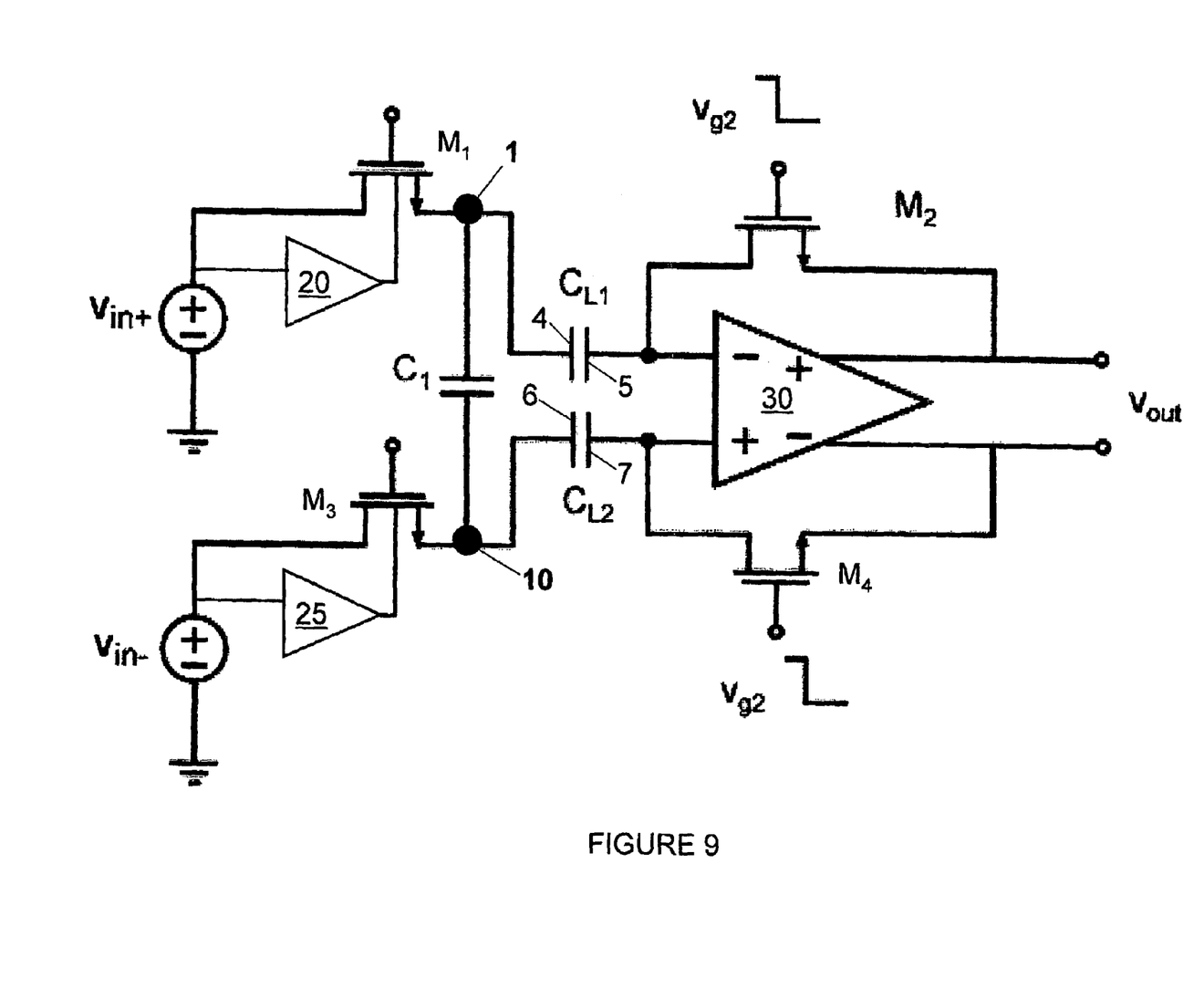
FIG. 9 illustrates fourth fully-differential closed-loop sampling switch according to the concepts of the present invention.

FIG. 9 illustrates a fourth example of a fully differential closed-loop sampling circuit being employed in order to improve power supply, substrate rejection, and removal of a differential component of the nonlinear input dependent charge injection. As illustrated in FIG. 9, a sampling switch $M_2$, when turned ON, connects the inverting input and the non-inverting output of a differential amplifier 30. With an input switch $M_1$ turned ON, a first plate 4 of sampling capacitor $C_{L1}$ receives the input voltage $V_{in+}$, while a second plate 5 of the sampling capacitor $C_{L1}$ settles to a common-mode voltage of the differential amplifier 30.

Moreover, as illustrated in FIG. 9, a sampling switch $M_4$, when turned ON, connects the non-inverting input and the inverting output of a differential amplifier 30. With an input switch $M_3$ turned ON, a first plate 6 of sampling capacitor $C_{L2}$ receives the input voltage $V_{in-}$, while a second plate 7 of the sampling capacitor $C_{L2}$ settles to a common-mode voltage of the differential amplifier 30. A capacitor $C_1$, which is substantially more linear than a variable parasitic capacitance $C_{P3}$ of the input switch $M_3$ or a variable parasitic capacitance $C_{P1}$ of the input switch $M_1$, is connected between Node 1 and Node 10.

In this embodiment, an effective capacitance, twice the value of $C_1$, and variable parasitic capacitance $C_{P1}$ are effectively in parallel and the capacitance value of capacitor $C_1$ may be significantly larger than the variable parasitic capacitance $C_{P1}$. When the sampling switch $M_2$ is turned OFF, charge is sampled on the capacitor $C_{L1}$.

The parasitic capacitance $C_{P1}$ is made substantially independent of the input voltage by bootstrapping the back gate of the input switch $M_1$. A buffer amplifier 20 is connected between the input voltage and the back gate of the input switch $M_1$. The voltage across the parasitic capacitance $C_{P1}$ is approximately zero regardless of the input voltage.

Alternatively, the buffer amplifier 20 can be made to have a constant offset voltage such that a prescribed DC voltage is maintained across the parasitic capacitance $C_{P1}$.

Moreover, an effective capacitance, twice the value of $C_1$, and variable parasitic capacitance $C_{P3}$ are effectively in parallel and the capacitance value of capacitor $C_1$ may be significantly larger than the variable parasitic capacitance $C_{P3}$. When the sampling switch $M_4$ is turned OFF, charge is sampled on the capacitor $C_{L2}$. A second buffer amplifier 25 is connected between the input voltage and the back gate of the input switch $M_3$. The voltage across the parasitic capacitance $C_{P3}$ is approximately zero regardless of the input voltage.

Alternatively, the buffer amplifier 25 can be made to have a constant offset voltage such that a prescribed DC voltage is maintained across the parasitic capacitance $C_{p3}$.

The closed-loop sampling of FIG. 9 also removes the effect of the offset voltage associated with the differential amplifier 30 and removes the differential component of the nonlinear input dependent charge injection associated with the differential amplifier 30, thereby enabling the fully differential closed-loop sampling circuit of FIG. 9 to be appropriate for analog-to-digital converters and other precision sampled-data circuits. Furthermore, the sampling circuit of FIG. 9 reduces the effect of substrate noise.

Figure 10:
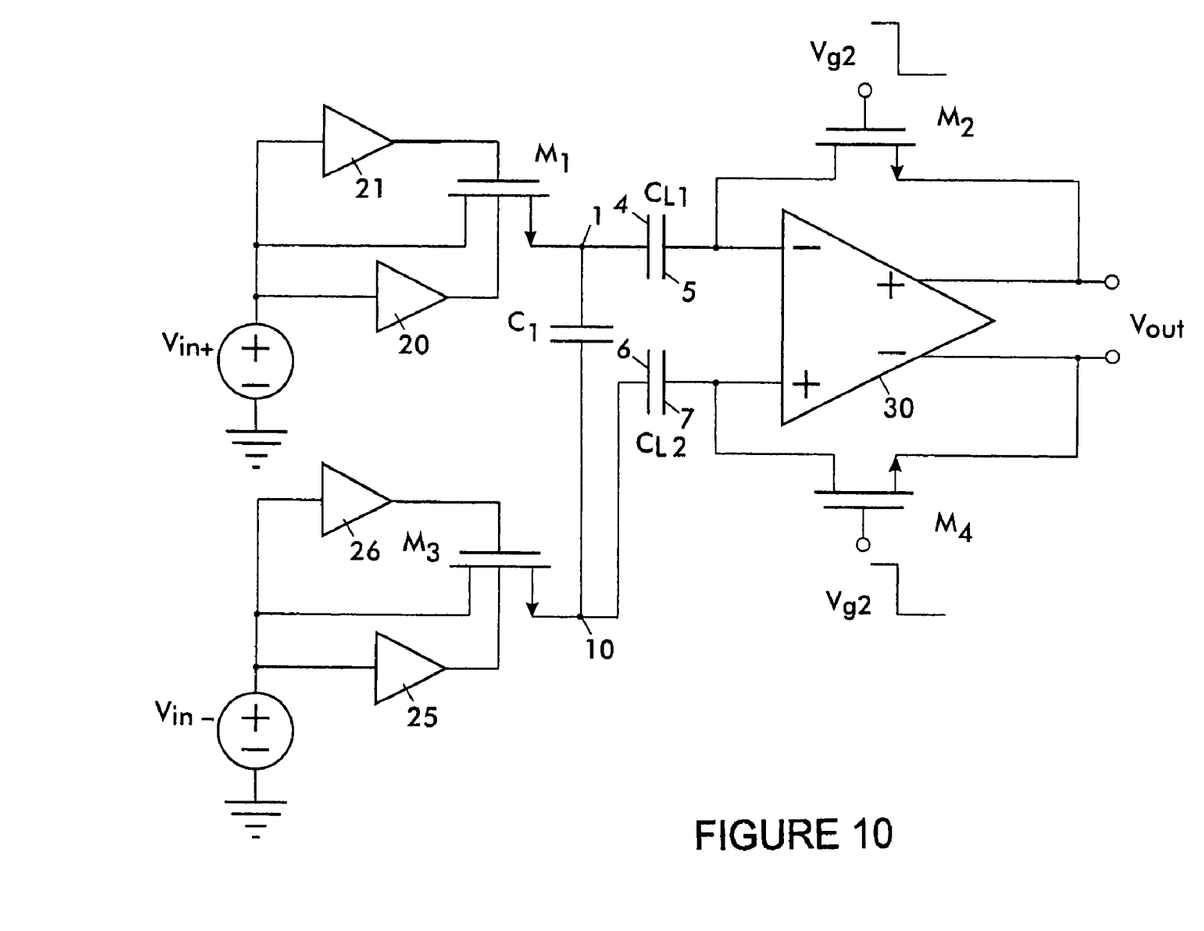
FIGS. 10-12 illustrates further fully-differential closed-loop sampling switches according to the concepts of the present invention.

FIG. 10 illustrates a fifth example of a fully differential closed-loop sampling circuit being employed in order to improve power supply, substrate rejection, and removal of a differential component of the nonlinear input dependent charge injection. As illustrated in FIG. 10, a sampling switch $M_2$, when turned ON, connects the inverting input and the non-inverting output of a differential amplifier 30. With an input switch $M_1$ turned ON, a first plate 4 of sampling capacitor $C_{L1}$ receives the input voltage $V_{in}$, while a second plate 5 of the sampling capacitor $C_{L1}$ settles to a common-mode voltage of the differential amplifier 30.

Moreover, as illustrated in FIG. 10, a sampling switch $M_4$, when turned ON, connects the non-inverting input and the inverting output of a differential amplifier 30. With an input switch $M_3$ turned ON, a first plate 6 of sampling capacitor $C_{L2}$ receives the input voltage $V_{in}$, while a second plate 7 of the sampling capacitor $C_{L2}$ settles to a common-mode voltage of the differential amplifier 30. A capacitor $C_1$, which is substantially more linear than a variable parasitic capacitance $C_{P3}$ of the input switch $M_3$ or a variable parasitic capacitance $C_{P1}$ of the input switch $M_1$, is connected between Node 1 and Node 10.

In this embodiment, an effective capacitance, twice the value of $C_1$, and variable parasitic capacitance $C_{P1}$ are effectively in parallel and the capacitance value of capacitor $C_1$ may be significantly larger than the variable parasitic capacitance $C_{P1}$. When the sampling switch $M_2$ is turned OFF, charge is sampled on the capacitor $C_{L1}$.

Both the parasitic capacitance $C_{p1}$ and the $R_{ON1}$ resistance of the input switch $M_1$ are kept constant. The parasitic capacitance $C_{p1}$ is kept constant by keeping the voltage across $C_{p1}$ constant in the same manner as in FIG. 9. The $R_{ON1}$ resistance of the input switch $M_1$ is kept constant by bootstrapping the gate of input switch $M_1$ when it is turned ON by tying the gate of the input switch $M_1$ to the output of a third buffer amplifier 21. The third buffer amplifier 21 biases the gate of the input switch $M_1$ at a voltage that is offset by a constant amount from the input voltage $V_{in}$. This keeps the gate-to-source voltage of the input switch $M_1$ constant. Since the threshold voltage of the input switch $M_1$ is kept constant by the back gate bootstrapping, the $R_{ON1}$ resistance of the input switch $M_1$ is constant regardless of the input voltage.

Moreover, the parasitic capacitance $C_{p3}$ and the $R_{ON3}$ resistance of the input switch $M_3$ are kept constant. The parasitic capacitance $C_{p3}$ is kept constant by keeping the voltage across $C_{p3}$ constant in the same manner as in FIG. 9. The $R_{ON3}$ resistance of the input switch $M_3$ is kept constant by bootstrapping the gate of input switch $M_3$ when it is turned ON by tying the gate of the input switch $M_3$ to the output of a fourth buffer amplifier 26. The fourth buffer amplifier 26 biases the gate of the input switch $M_3$ at a voltage that is offset by a constant amount from the input voltage $V_{in}$. When the input switch $M_3$ is turned OFF, the gate is tied to a constant voltage, for example, ground potential. This keeps the gate-to-source voltage of the input switch $M_3$ constant. Since the threshold voltage of the input switch $M_3$ is kept constant by the back gate bootstrapping, the $R_{ON3}$ resistance of the input switch $M_3$ is constant regardless of the input voltage.

The closed-loop sampling of FIG. 10 also removes the effect of the offset voltage associated with the differential amplifier 30 and removes the differential component of the nonlinear input dependent charge injection associated with the differential amplifier 30, thereby enabling the fully differential closed-loop sampling circuit of FIG. 10 to be appropriate for analog-to-digital converters and other precision sampled-data circuits. Furthermore, the sampling circuit of FIG. 10 reduces the effect of substrate noise.

Figure 11:
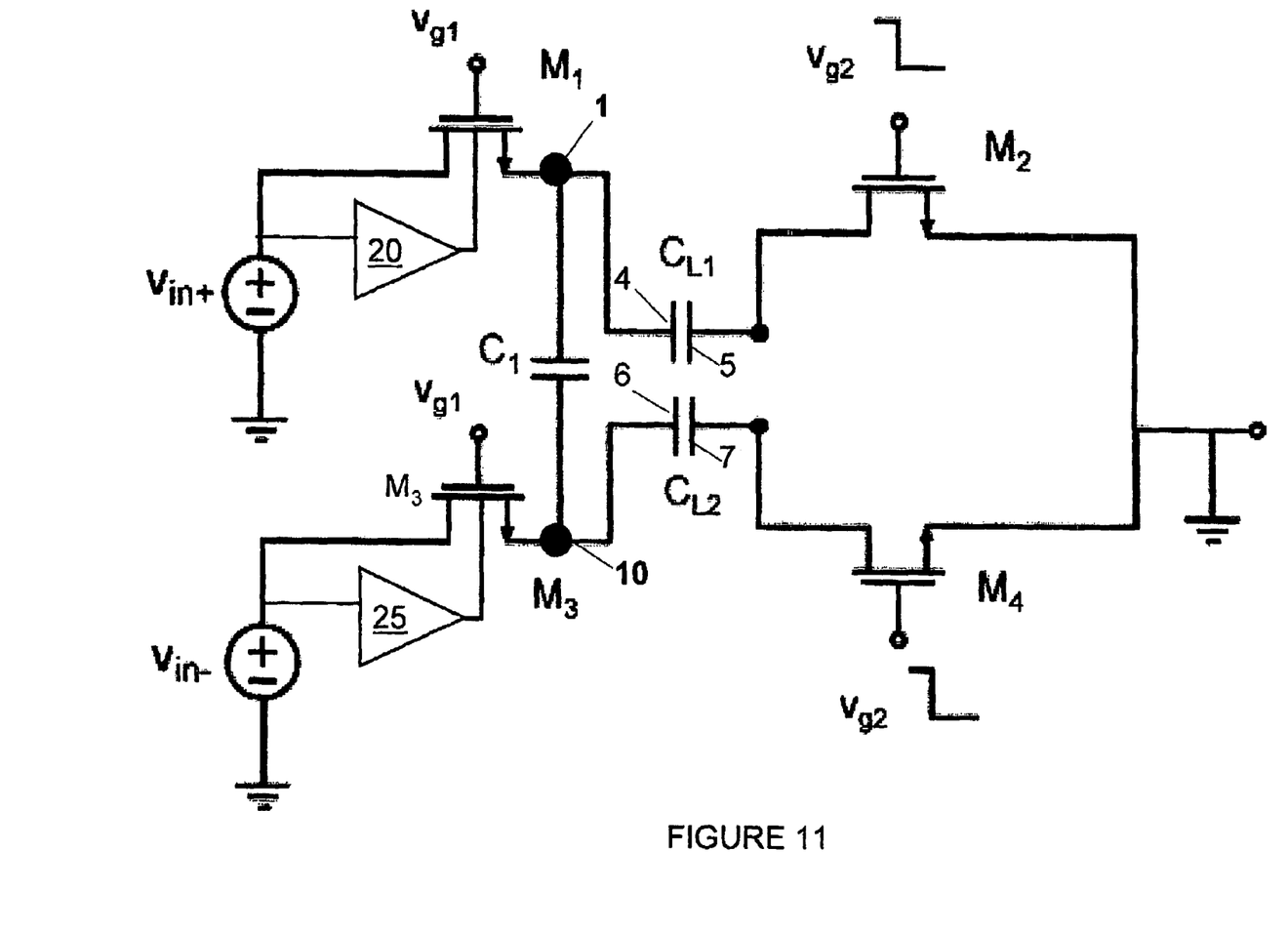

FIG. 11 illustrates another example of a fully differential sampling circuit being employed in order to improve power supply, substrate rejection, and removal of a differential component of the nonlinear input dependent charge injection. As illustrated in FIG. 11, when an input switch $M_1$ is turned ON, a first plate 4 of sampling capacitor $C_{L1}$ receives the input voltage $V_{in+}$. A sampling switch $M_2$, when turned ON, connects a second plate 5 of the sampling capacitor $C_{L1}$ to a constant voltage, preferably a common-mode voltage.

Moreover, as illustrated in FIG. 11 when an input switch $M_3$ is turned ON, a first plate 6 of sampling capacitor $C_{L2}$ receives the input voltage $V_{in-}$. A sampling switch $M_2$, when turned ON, connects a second plate 7 of the sampling capacitor $C_{L2}$ to a constant voltage, preferably a common-mode voltage. A capacitor $C_1$, which is substantially more linear than a variable parasitic capacitance $C_{P3}$ of the input switch $M_3$ or a variable parasitic capacitance $C_{P1}$ of the input switch $M_1$, is connected between Node 1 and Node 10.

In this embodiment, an effective capacitance, twice the value of $C_1$, and variable parasitic capacitance $C_{P1}$ are effectively in parallel and the capacitance value of capacitor $C_1$ may be significantly larger than the variable parasitic capacitance $C_{P1}$. When the sampling switch $M_2$ is turned OFF, charge is sampled on the capacitor $C_{L1}$.

The parasitic capacitance $C_{P1}$ is made substantially independent of the input voltage by bootstrapping the back gate of the input switch $M_1$. A buffer amplifier 20 is connected between the input voltage and the back gate of the input switch $M_1$. The voltage across the parasitic capacitance $C_{P1}$ is approximately zero regardless of the input voltage.

Alternatively, the buffer amplifier 20 can be made to have a constant offset voltage such that a prescribed DC voltage is maintained across the parasitic capacitance $C_{p1}$.

Moreover, an effective capacitance, twice the value of $C_1$, and variable parasitic capacitance $C_{P3}$ are effectively in parallel and the capacitance value of capacitor $C_1$ may be significantly larger than the variable parasitic capacitance $C_{P3}$. When the sampling switch $M_4$ is turned OFF, charge is sampled on the capacitor $C_{L2}$. A second buffer amplifier 25 is connected between the input voltage and the back gate of the input switch $M_3$. The voltage across the parasitic capacitance $C_{P3}$ is approximately zero regardless of the input voltage.

Alternatively, the buffer amplifier 25 can be made to have a constant offset voltage such that a prescribed DC voltage is maintained across the parasitic capacitance $C_{p3}$.

The sampling circuit of FIG. 11 removes the nonlinear input dependent charge injection, thereby enabling the fully differential closed-loop sampling circuit of FIG. 11 to be appropriate for analog-to-digital converters and other precision sampled-data circuits. Furthermore, the sampling circuit of FIG. 11 reduces the effect of substrate noise.

Figure 12:
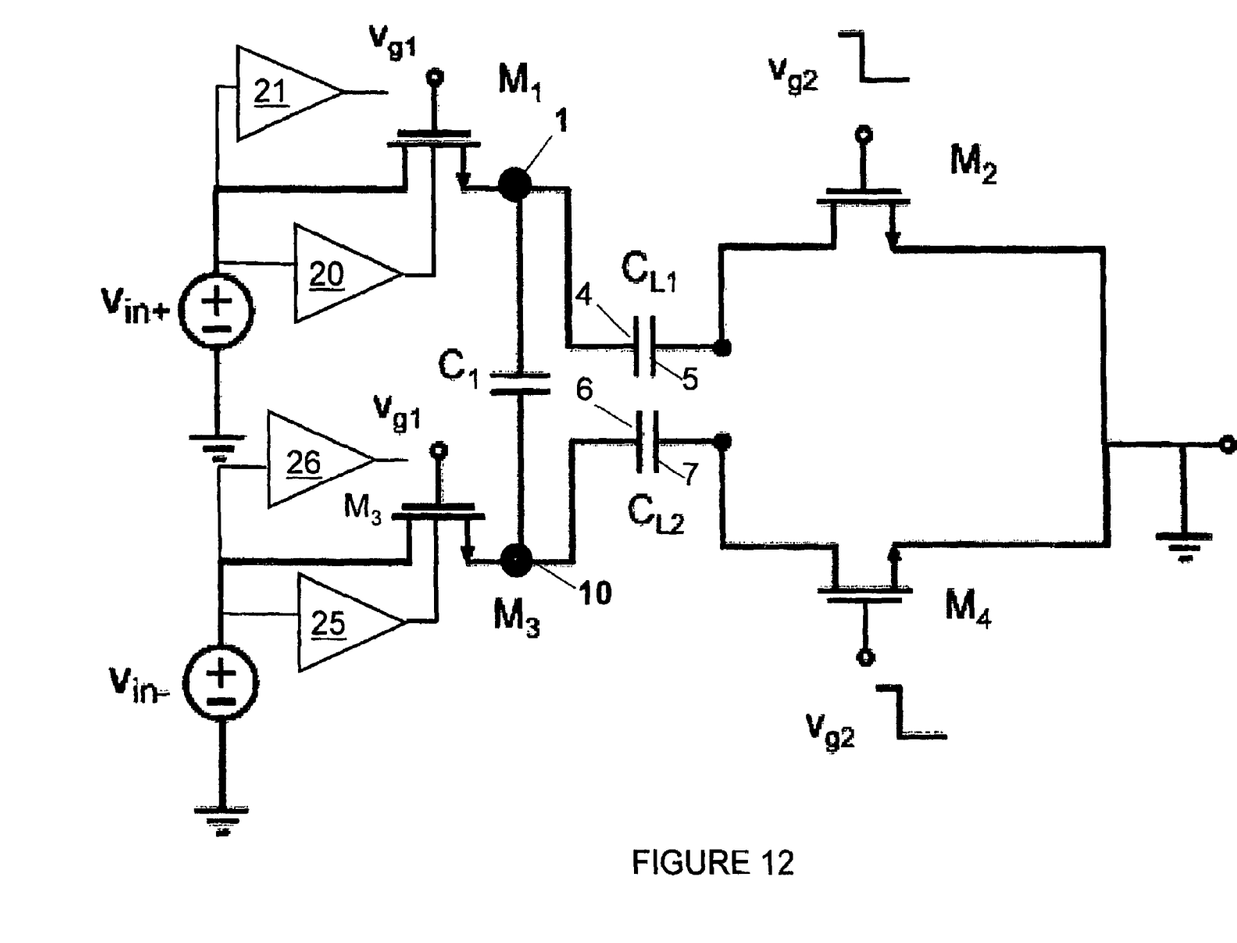

FIG. 12 illustrates another example of a fully differential sampling circuit being employed in order to improve power supply, substrate rejection, and removal of a differential component of the nonlinear input dependent charge injection. As illustrated in FIG. 12, when an input switch $M_1$ is turned ON, a first plate 4 of sampling capacitor $C_{L1}$ receives the input voltage $V_{in+}$. A sampling switch $M_2$, when turned ON, connects a second plate 5 of the sampling capacitor $C_{L1}$ to a constant voltage, preferably a common-mode voltage.

Moreover, as illustrated in FIG. 12 when an input switch $M_3$ is turned ON, a first plate 6 of sampling capacitor $C_{L2}$ receives the input voltage $V_{in-}$. A sampling switch $M_2$, when turned ON, connects a second plate 7 of the sampling capacitor $C_{L2}$ to a constant voltage, preferably a common-mode voltage. A capacitor $C_1$, which is substantially more linear than a variable parasitic capacitance $C_{P3}$ of the input switch $M_3$ or a variable parasitic capacitance $C_{P1}$ of the input switch $M_1$, is connected between Node 1 and Node 10.

In this embodiment, an effective capacitance, twice the value of $C_1$, and variable parasitic capacitance $C_{P1}$ are effectively in parallel and the capacitance value of capacitor $C_1$ may be significantly larger than the variable parasitic capacitance $C_{P1}$. When the sampling switch $M_2$ is turned OFF, charge is sampled on the capacitor $C_{L1}$.

Both the parasitic capacitance $C_{p1}$ and the $R_{ON1}$ resistance of the input switch $M_1$ are kept constant. The parasitic capacitance $C_{p1}$ is kept constant by keeping the voltage across $C_{p1}$ constant in the same manner as in FIG. 9. The $R_{ON1}$ resistance of the input switch $M_1$ is kept constant by bootstrapping the gate of input switch $M_1$ when it is turned ON by tying the gate of the input switch $M_1$ to the output of a third buffer amplifier 21. The third buffer amplifier 21 biases the gate of the input switch $M_1$ at a voltage that is offset by a constant amount from the input voltage $V_{in}$. This keeps the gate-to-source voltage of the input switch $M_1$ constant. Since the threshold voltage of the input switch $M_1$ is kept constant by the back gate bootstrapping, the $R_{ON1}$ resistance of the input switch $M_1$ is constant regardless of the input voltage.

Moreover, the parasitic capacitance $C_{p3}$ and the $R_{ON3}$ resistance of the input switch $M_3$ are kept constant. The parasitic capacitance $C_{p3}$ is kept constant by keeping the voltage across $C_{p3}$ constant in the same manner as in FIG. 9. The $R_{ON3}$ resistance of the input switch $M_3$ is kept constant by bootstrapping the gate of input switch $M_3$ when it is turned ON by tying the gate of the input switch $M_3$ to the output of a fourth buffer amplifier 26. The fourth buffer amplifier 26 biases the gate of the input switch $M_3$ at a voltage that is offset by a constant amount from the input voltage $V_{in}$. When the input switch $M_3$ is turned OFF, the gate is tied to a constant voltage, for example, ground potential. This keeps the gate-to-source voltage of the input switch $M_3$ constant. Since the threshold voltage of the input switch $M_3$ is kept constant by the back gate bootstrapping, the $R_{ON3}$ resistance of the input switch $M_3$ is constant regardless of the input voltage.

The sampling circuit of FIG. 12 also removes the nonlinear input dependent charge injection, thereby enabling the fully differential closed-loop sampling circuit of FIG. 12 to be appropriate for analog-to-digital converters and other precision sampled-data circuits. Furthermore, the sampling circuit of FIG. 12 reduces the effect of substrate noise.

In summary, a capacitor, which is substantially more linear than a variable parasitic capacitance of a source-side transistor, is connected in parallel to the variable parasitic capacitance of a source-side transistor to reduce the dependence of charge split ratio on the input voltage. Furthermore, the capacitor reduces the effect of substrate noise.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A The sampling circuit comprising:
   an input voltage source;
   a first switch having an input operatively connected to said input voltage source;
   a first capacitor operatively connected to an output of said first switch;
   a second switch having an input operatively connected to said first capacitor;
   a second input voltage source;
   a third switch having an input operatively connected to said second input voltage source;
   a second capacitor operatively connected to an output of said third switch;
   a fourth switch having an input operatively connected to said second capacitor; and
   a third capacitor being operatively connected across said output of said third switch and said output of said first switch.

2. The sampling circuit as claimed in claim 1, wherein said third switch has a variable parasitic capacitance and said third capacitor has a capacitance greater than the variable parasitic capacitance of said third switch.

3. The sampling circuit as claimed in claim 1, wherein said third switch has a variable parasitic capacitance and a combined variable parasitic capacitance of said third switch and capacitance of said third capacitor is more linear than the variable parasitic capacitance of said third switch.

4. The sampling circuit as claimed in claim 1, further comprising a first buffer amplifier operatively connected between said first input voltage source and a back-gate of said first switch.

5. The sampling circuit as claimed in claim 1, further comprising a first amplifier operatively connected to a gate of said first switch to bias the gate of said first switch at a voltage that is offset by a constant amount from an input voltage of said first input voltage source.

6. The sampling circuit as claimed in claim 1, further comprising:
   a first buffer amplifier operatively connected between said first input voltage source and a back-gate of said first switch; and
   a second buffer amplifier operatively connected between said second input voltage source and a back-gate of said third switch.

7. The sampling circuit as claimed in claim 6, further comprising:
   a first amplifier operatively connected to a gate of said first switch to bias the gate of said first switch at a voltage that is offset by a constant amount from an input voltage of said first input voltage source; and
   a second amplifier operatively connected to a gate of said third switch to bias the gate of said third switch at a voltage that is offset by a constant amount from an input voltage of said second input voltage source.

8. A sampling circuit comprising:
   an input voltage source;
   a first switch having an input operatively connected to said input voltage source;
   a first capacitor operatively connected to an output of said first switch;
   a differential amplifier having an inverting input operatively connected to said first capacitor;
   a second switch operatively connected across the inverting input of said differential amplifier and a non-inverting output of said differential amplifier;
   a second input voltage source;
   a third switch having an input operatively connected to said second input voltage source;
   a second capacitor operatively connected to an output of said third switch;
   a fourth switch operatively connected across a non-inverting input of said differential amplifier and an inverting output of said differential amplifier; and
   a third capacitor being operatively connected across said output of said third switch and said output of said first switch.

9. The sampling circuit as claimed in claim 8, wherein said third switch has a variable parasitic capacitance and said third capacitor has a capacitance greater than the variable parasitic capacitance of said third switch.

10. The sampling circuit as claimed in claim 8, wherein said third switch has a variable parasitic capacitance and a combined variable parasitic capacitance of said third switch and capacitance of said third capacitor is more linear than the variable parasitic capacitance of said third switch.

11. The sampling circuit as claimed in claim 8, further comprising:
    a first buffer amplifier operatively connected between said first input voltage source and a back-gate of said first switch; and
    a second buffer amplifier operatively connected between said second input voltage source and a back-gate of said third switch.

12. The sampling circuit as claimed in claim 11, further comprising:
    a first amplifier operatively connected to a gate of said first switch to bias the gate of said first switch at a voltage that is offset by a constant amount from an input voltage of said first input voltage source; and
    a second amplifier operatively connected to a gate of said third switch to bias the gate of said third switch at a voltage that is offset by a constant amount from an input voltage of said second input voltage source.

13. The sampling circuit as claimed in claim 8, further comprising:
    a first buffer amplifier operatively connected between said first input voltage source and a back-gate of said first switch; and
    a second buffer amplifier operatively connected between said second input voltage source and a back-gate of said third switch.

14. The sampling circuit as claimed in claim 13, further comprising:
    a first amplifier operatively connected to said gate of said first switch to bias the gate of said first switch at a voltage that is offset by a constant amount from an input voltage of said first input voltage source; and
    a second amplifier operatively connected to said gate of said third switch to bias the gate of said third switch at a voltage that is offset by a constant amount from an input voltage of said second input voltage source.

* * * * *